United States Patent
Yi et al.

(10) Patent No.: US 7,433,203 B1
(45) Date of Patent: Oct. 7, 2008

(54) TECHNIQUES FOR PROVIDING AN EMI SEAL FOR A CIRCUIT BOARD

(75) Inventors: George Youzhi Yi, Fremont, CA (US); William Jeffrey Lewis, Mountain View, CA (US); Hung-Ting Lin, Taipei (TW); Kuang Hsin Hsu, Taipei (TW)

(73) Assignee: Cisco Technology, Inc., San Jose, CA (US)

( * ) Notice: Subject to any disclaimer, the term of this patent is extended or adjusted under 35 U.S.C. 154(b) by 279 days.

(21) Appl. No.: 11/290,015

(22) Filed: Nov. 30, 2005

(51) Int. Cl.
*H05K 7/18* (2006.01)

(52) U.S. Cl. .................. 361/800; 361/816; 361/818; 361/796; 361/752; 361/753

(58) Field of Classification Search ............ 361/679, 361/816, 818, 796, 800, 686
See application file for complete search history.

(56) References Cited

U.S. PATENT DOCUMENTS

| | | | | |
|---|---|---|---|---|
| 5,043,716 A * | 8/1991 | Latz et al. | ............ | 345/82 |
| 5,119,047 A * | 6/1992 | Brown et al. | ............ | 333/12 |
| 5,586,011 A | 12/1996 | Alexander | ............ | 361/818 |
| 5,901,040 A * | 5/1999 | Cromwell et al. | ............ | 361/704 |
| 6,151,452 A * | 11/2000 | Ping | ............ | 396/60 |
| 6,163,454 A * | 12/2000 | Strickler | ............ | 361/695 |
| 6,304,458 B1 * | 10/2001 | Mendolia | ............ | 361/814 |
| 6,596,937 B2 | 7/2003 | Mazurkiewicz | ............ | 174/35 R |
| 6,600,101 B2 | 7/2003 | Mazurkiewicz | ............ | 174/35 MS |
| 6,650,296 B2 * | 11/2003 | Wong et al. | ............ | 343/700 MS |
| 6,717,485 B2 | 4/2004 | Kolb et al. | ............ | 333/12 |
| 6,743,975 B2 | 6/2004 | Kolb | ............ | 174/35 R |
| 6,812,803 B2 | 11/2004 | Goergen | ............ | 333/1 |
| 6,849,800 B2 | 2/2005 | Mazurkiewicz | ............ | 174/35 MS |
| 6,900,383 B2 | 5/2005 | Babb | ............ | 174/35 MS |
| 7,008,483 B2 | 3/2006 | Mann | ............ | 118/500 |
| 7,085,142 B2 * | 8/2006 | Berberich | ............ | 361/818 |
| 7,196,275 B2 * | 3/2007 | Babb et al. | ............ | 174/382 |
| 2006/0131477 A1 * | 6/2006 | Lye et al. | ............ | 250/208.1 |
| 2007/0081311 A1 * | 4/2007 | Iwamiya et al. | ............ | 361/760 |

* cited by examiner

*Primary Examiner*—Dean A. Reichard
*Assistant Examiner*—Hoa C Nguyen
(74) *Attorney, Agent, or Firm*—BainwoodHuang

(57) ABSTRACT

A circuit board includes a first circuit board section which is configured to support a set of light emitting diodes, a second circuit board section which is configured to support high-speed electronic circuitry, and a boundary section which defines an EMI boundary between the first circuit board section and the second circuit board section. The boundary section includes a set of outer surface elongated ground strips configured to form an EMI seal onto which a set of EMI shields is capable of mounting. In some arrangements, the set of outer surface elongated ground strips take the form of metallic bands (e.g., layers of copper). Such bands can be integrated into the circuit board itself (e.g., during PCB fabrication), or added onto one or more of the circuit board surfaces (e.g., after PCB fabrication).

20 Claims, 4 Drawing Sheets

TECHNIQUES FOR PROVIDING AN EMI SEAL FOR A CIRCUIT BOARD

BACKGROUND

A typical printed circuit board (PCB) includes multiple conductive and non-conductive layers which are sandwiched together into a rigid structure which is planar in shape. This rigid plane-shaped structure provides a dense network of electrical pathways which connect a variety of circuit board components together. Such components may include, among other things, integrated circuit (IC) devices (e.g., high-speed area array packages, field programmable gate arrays, serializer/de-serializer interfaces, processors, memories, etc.), discrete components (e.g., diodes, resistors, capacitors, light emitting diodes, etc.), connectors, and so on.

There are other items that interface with PCBs as well. For example, a light pipe is an elongated device having one end adjacent a light emitting diode (LED) and another end at a distal location from the LED which may be several inches away (e.g., at a front panel of a cabinet, at a display on an electronic housing, etc.). Such a light pipe is typically made of clear plastic or a similar material. During operation, the light pipe is configured to carry light from the LED to the distal location.

Another PCB item is an electromagnetic interference (EMI) shield. An EMI shield is a device which is configured to prevent passage of EMI from one location to another. One conventional EMI shield is in the form of a metallic chassis which completely surrounds a circuit board. Another conventional EMI shield is in the form of a metallic module cage which works, in combination with a circuit board, to enclose an individual circuit board component (e.g., a high-speed optical transducer).

SUMMARY

Unfortunately, there are deficiencies to the above-described conventional EMI shields. For example, in connection with the above-described conventional metallic chassis which surrounds the circuit board entirely, light from any LEDs on the circuit board will have difficulty being seen by a user. That is, air holes defined by the metallic chassis are typically too small to enable the user to reliability view the LEDs. Furthermore, if the manufacturer were to provide larger light pipe holes within the metallic chassis to enable light pipes to convey the LED light from the LEDs to external locations, the larger light pipe holes would impair the EMI shielding operation of the metallic chassis.

Additionally, in connection with the above-described conventional metallic module cage which protects an individual circuit board component, the metallic module cage consumes a significant amount of circuit board real estate compared to the amount of EMI shielding the cage provides. Moreover, mounting holes for such a module cage require additional space (e.g., the actual holes, keep out regions around the actual holes, etc.). Often the positioning of such holes is in critical areas such as where there is a high-density of signal traces leading to and from the circuit board component. Accordingly, if EMI protection for many components is required, the metallic module cage is an ineffective EMI solution.

In contrast to the above-described conventional EMI shielding approaches, an improved EMI shielding technique involves utilization of a boundary section of a circuit board which defines an EMI boundary between two other circuit board sections, e.g., one section that supports LEDs and another section that supports high-speed electronic circuitry in the form of multiple circuit board components. The boundary section includes a set of outer surface elongated ground strips (e.g., embedded outer surface metallic bands) configured to form an EMI seal onto which a set of EMI shields is capable of mounting. For such a situation, the set of EMI shields in combination with the boundary section will be able to provide reliable EMI shielding for circuitry requiring EMI protection (e.g., the high-speed electronic circuitry) while enabling other circuits to remain exposed (e.g., the LEDs) for more convenient access.

One embodiment is directed to a circuit board including a first circuit board section which is configured to support a set of light emitting diodes, a second circuit board section which is configured to support high-speed electronic circuitry, and a boundary section which defines an EMI boundary between the first circuit board section and the second circuit board section. The boundary section includes a set of outer surface elongated ground strips configured to form an EMI seal onto which a set of EMI shields is capable of mounting. In some arrangements, the set of outer surface elongated ground strips take the form of metallic bands (e.g., bands of exposed copper). Such bands can be integrated into the circuit board itself (e.g., during PCB fabrication), or added onto one or more of the circuit board surfaces (e.g., after PCB fabrication).

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

An improved EMI shielding technique involves utilization of a boundary section of a circuit board which defines an EMI boundary between two other circuit board sections, e.g., one section that supports LEDs and another section that supports high-speed electronic circuitry in the form of multiple circuit board components. The boundary section includes a set of outer surface elongated ground strips (e.g., outer surface metallic bands) configured to form an EMI seal onto which a set of EMI shields is capable of mounting. For such a situation, the set of EMI shields in combination with the boundary section will be able to provide EMI shielding for circuitry requiring EMI protection (e.g., the high-speed electronic circuitry) while enabling other circuits to remain outside the EMI barrier (e.g., the LEDs) for more convenient access.

Figure 1:
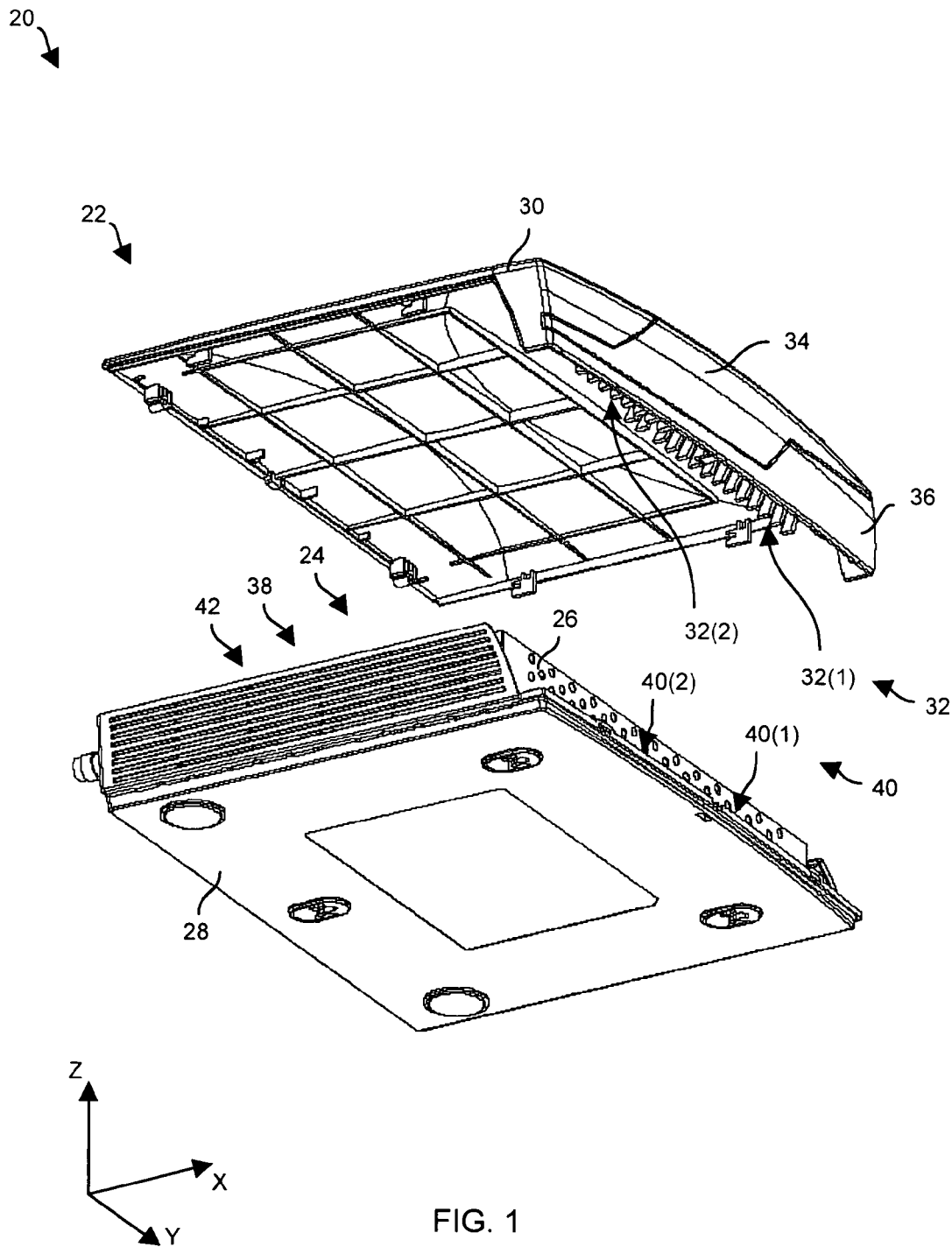
FIG. 1 is a perspective view of an electronic system which employs a circuit board having an EMI boundary section between two other circuit board sections.

FIG. 1 shows an electronic system 20 having an enclosure 22, a circuit board module 24 (illustrated in FIG. 1 generally by the arrow 24) and a set of EMI shields 26. As shown, the enclosure 22 includes a base 28, a cover 30, and an assembly of light pipes 32. The cover 30 has a transparent portion 34 (e.g., a user display) and an opaque portion 36. As shown by the angle of FIG. 1, the assembly of light pipes 32 fastens to the cover 30. In particular, the assembly of light pipes 32 is disposed adjacent the transparent portion 34 of the cover 30. In some arrangements, the light pipes 32 are rigidly attached to the transparent portion 34 of the cover 30 (e.g., snap fit in place, fused using heat, etc.).

As will be explained in further detail shortly, the circuit board module 24 includes a circuit board 38 (illustrated by the arrow 38 in FIG. 1), a set of LEDs 40 (illustrated generally by the arrow 40 in FIG. 1) and high-speed circuitry 42 (illustrated generally by the arrow 42 in FIG. 1). It should be understood that the high-speed circuitry 42 multiple packaged components (e.g., ASICs, processors, FPGAs, etc.), other electrical structures that potentially operate as antennae for high-speed electrical signals (wire leads, pins, connectors, etc.), and so on. Advantageously, however, the circuit board 38 includes an EMI boundary section between two other circuit board sections which forms a reliable EMI seal for the high-speed circuitry 42.

During operation of the high-speed circuitry 42, the set of LEDs 40 provides visual information to a user. In particular, the light pipe assembly 32 conveys light from the LEDs 40 of the circuit board module 24 to the transparent portion 34 of the cover 30, and the transparent portion 34 permits light from the LEDs 40 to pass therethrough for visual detection by the user. In some arrangements, the assembly of light pipes 32 includes multiple light pipe rows 32(1), 32(2), . . . , and the circuit board module 24 includes multiple LED rows 40(1), 40(2), . . . corresponding to the light pipe rows 32(1), 32(2), . . . Such a configuration provides a configuration which enables the user to quickly and effectively determine the operating status of the electronic system 20. Further details will now be provided with reference to FIG. 2.

Figure 2:
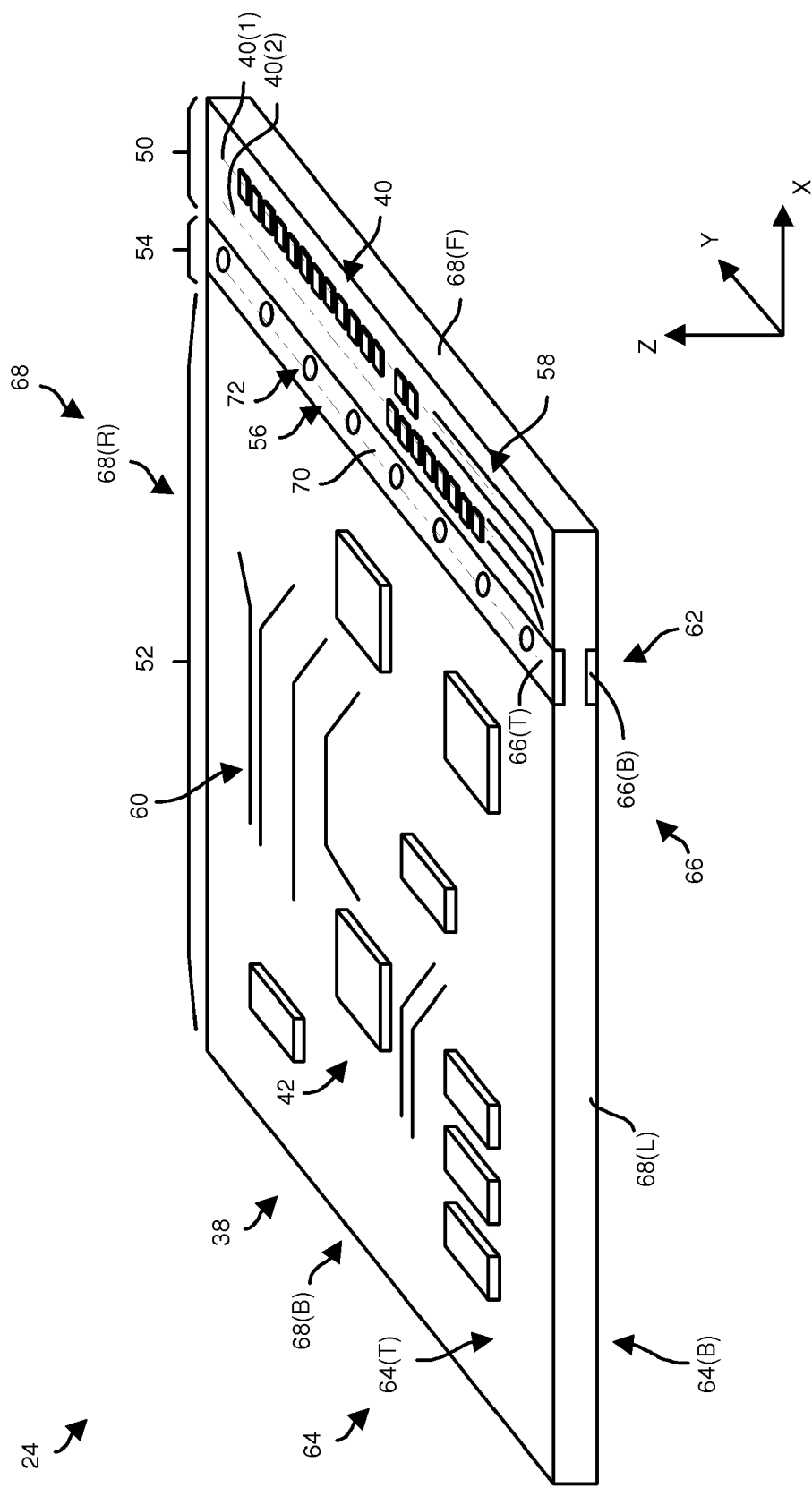
FIG. 2 is a perspective view of a circuit board of the electronic system of FIG. 1.

FIG. 2 is a perspective view of the circuit board module 24. As shown in FIG. 2, the circuit board 38 of the circuit board module 24 includes a circuit board section 50 which is configured to support the set of LEDs 40, a second circuit board section 52 which is configured to support the high-speed electronic circuitry 42, and a boundary section 54 which defines an electromagnetic interference boundary 56 between the circuit board sections 50, 52 along the Y-direction. The circuit board section 50 defines conductive circuit board structures 58 such as mounting locations for mounting the LEDs 40, and signal traces and power supply planes for operating the LEDs 40. Similarly, the circuit board section 52 defines conductive circuit board structures 60 such as mounting locations for mounting the high-speed circuitry 42, and signal traces and power supply planes for operating the high-speed circuitry 42. The boundary section 54 includes a set of outer surface elongated ground strips 62 configured to form an EMI seal.

The LED circuit board section 50 does not include any signal traces that purposefully carry high-speed signals of the high-speed circuitry 42. That is, the LED circuit board section 50 excludes conductive structures carrying high-speed signals for the high-speed electronic circuitry 42 thus enabling the LED circuit board section 50 to be a minimal source, if any, of EMI. Of course, the LED circuit board section 50 does include signal traces and power and ground planes to operate the LEDs 42 but the signals through such conductive structures do not provide disruptive EMI.

As further shown in FIG. 2, the circuit board 38 is a substantially flat structure (i.e., the circuit board 38 extends in the X-Y plane) and has a top outer surface 64(T) and a bottom outer surface 64(B) (collectively, surfaces 64). The outer surface elongated ground strips 62 include a top outer surface metallic band 66(T) disposed along the top outer surface 64(T), and a bottom outer surface metallic band 66(B) disposed along the bottom outer surface 64(B) (collectively, metallic bands 66). Such metallic bands 66 are preferably formed by circuit board material (e.g., copper) embedded as circuit board layers within the circuit board 38.

In addition to the surfaces 64, the circuit board 38 has a front edge 68(F), a right edge 68(R), a left edge 68(L) and a back edge 68(B) (collectively, circuit board edges 68). The front edge 68(F) extends along the circuit board section 50 which supports the LEDs 40. The back edge 68(B) extends along the circuit board section 52 which supports the high-speed circuitry 42. A long axis 70 of the boundary section 54 runs substantially parallel to the front and back edges 68(F), 68(B) (in the Y-direction), and substantially perpendicular to the right and left edges 68(R), 68(L). In some arrangements, one or more rows of plated-through-holes (PTHs) 72 runs along the long axis 70 for convenient connection of the EMI shields 26 (FIG. 1) to the circuit board 38. Further details will now be provided with reference to FIGS. 3 and 4.

Figure 3:
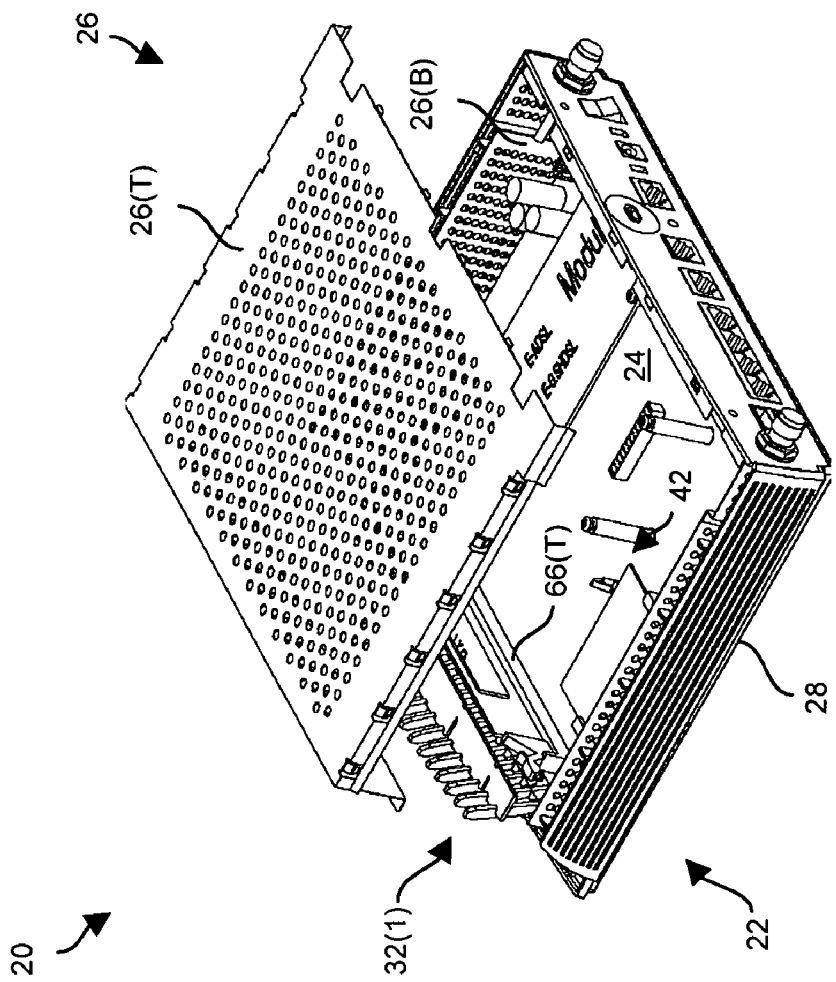
FIG. 3 is a perspective view of the electronic system of FIG. 1 from a rear angle with a top cover of an enclosure removed and with a row of light pipes of the enclosure remaining.
Figure 4:
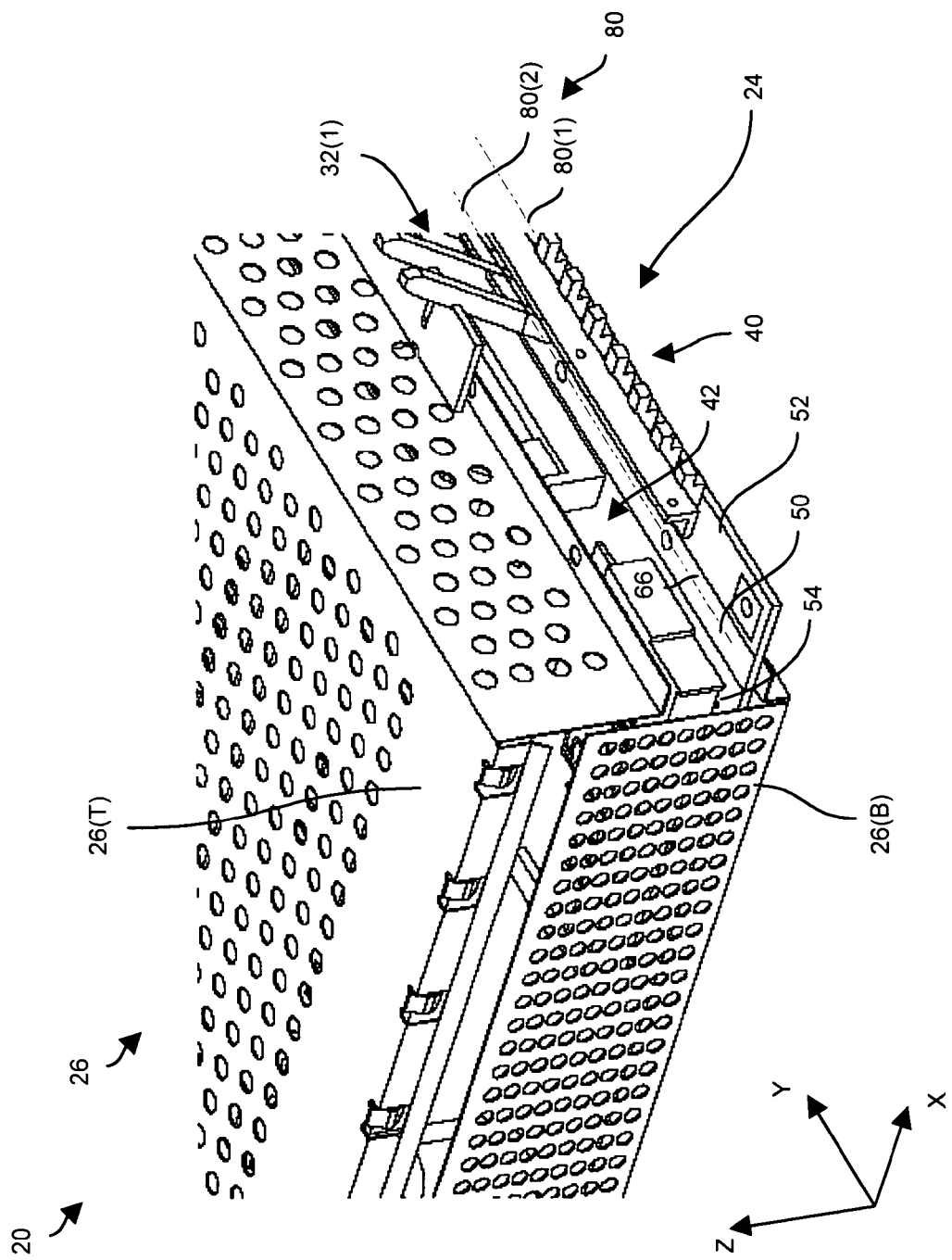
FIG. 4 is a detailed perspective view of a portion of the electronic system of FIG. 1 from a front angle with the enclosure completely removed.

FIG. 3 is a perspective view of the electronic system 20 from a rear angle with the top cover 30 removed but with a row of light pipes 32(1) remaining to illustrate the positioning of the light pipes relative to the circuit board module 24. FIG. 4 is a detailed perspective view from a front angle of the electronic system 20 with the enclosure 22 completely removed to illustrate further details of the set of EMI shields 26.

As shown in FIG. 3, when the circuit board module 24 is installed within the base 28 of the enclosure 22, the front edge 68(F) is adjacent the location for the light pipe assembly 32 (e.g., see the light pipe row 32(1)) and also adjacent the location for the transparent portion 34 of the cover 30 (also see FIG. 1).

The set of EMI shields 26 (FIG. 1) includes a top EMI shield 26(T) and a bottom EMI shield 26(B). Both EMI shields 26(T), 26(B) mount to the circuit board 38 with direct physical and electrical contact (e.g., using screws, in a pin-in-hole press-fit manner, etc.). In particular, the top EMI shield 26(T) connects to the top metallic band 66(T) and conceals high-speed circuitry 42 at the top of the circuit board section 52. Similarly, the bottom EMI shield 26(B) connects to the bottom metallic band 66(B) and conceals high-speed circuitry 42 at the bottom of the circuit board section 52.

Although, the EMI shields 26 have air holes for ventilation, the air holes are sized to minimize escape of EMI from the high-speed circuitry 42. In particular, the EMI shields 26 in combination with the boundary section 54 work together to form a Faraday cage around the high-speed circuitry 42 and the circuit board section 52. Accordingly, when the EMI shields 26 are in operating positions, a robust EMI barrier exists between the two circuit board sections 50, 52. Preferably, the metallic bands 66 extend edge-to-edge completely from the right edge 68(R) to the left edge 68(L) for a tight EMI seal (also see FIG. 2). Nevertheless, the EMI shields 26 do not completely surround the circuit board 38 (i.e., the circuit board section 50 is not within the EMI shield) and the LEDs 40 remain outside of the EMI barrier thus enabling the light pipe assembly 32 to conveniently convey light from the LEDs 40 mounted to the circuit board section 50 to the transparent portion 34 of the cover 30 without degrading the operation of the EMI shields 26.

FIG. 4 shows that the EMI shields 26(T), 26(B) are configured to engage each other and the circuit board section 50 to form a tight EMI barrier. Nevertheless, multiple rows 40(1), 40(2) of LEDs 40 disposed on respective axes 80(1), 80(2) which are substantially parallel to each other operate freely in an environment outside the EMI barrier. As a result, there is no need for any light pipe holes within the EMI shields 26(T), 26(B). Furthermore, the EMI shields 26(T), 26(B) in combination with the metallic bands 66 of the circuit board section 50 operate to provide substantial EMI isolation for the high-speed circuitry 42. Such a situation is well-suited for a variety of electronic applications such as a data communications devices (e.g., a router performing high-speed routing and/or switching operations).

As described above, an improved EMI shielding technique involves utilization of a boundary section 54 of a circuit board 38 which defines an EMI boundary between two other circuit board sections 50, 52, e.g., one section that supports LEDs 40 and another section that supports high-speed electronic circuitry 42 in the form of multiple circuit board components. The boundary section 54 includes a set of outer surface elongated ground strips 66 (e.g., outer surface metallic bands) configured to form an EMI seal onto which a set of EMI shields 26 is capable of mounting. For such a situation, the set of EMI shields 26 in combination with the boundary section 54 will be able to provide EMI shielding for circuitry requiring EMI protection (e.g., the high-speed electronic circuitry 42) while enabling other circuits (e.g., the LEDs 40) to remain exposed for more convenient access.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the above-described techniques are capable of being implemented in an electronic system having a chassis with other EMI sealing features. In particular, U.S. patent application Ser. No. 11/252,116 entitled "CHASSIS WITH MULTI-CANTILEVER SPRING FINGERS FOR EMI SHIELDING AND ESD PROTECTION OF ELECTRONIC DEVICES", the teachings of which are hereby incorporated by reference in their entirety, describes additional EMI protection features which are suitable for use with the electronic system 20 described above.

What is claimed is:

1. An electronic system, comprising:
   a set of light emitting diodes;
   high-speed electronic circuitry;
   a circuit board having (i) a first circuit board section which is configured to support the set of light emitting diodes, (ii) a second circuit board section which is configured to support the high-speed electronic circuitry, and (iii) a boundary section which defines an electromagnetic interference boundary between the first circuit board section and the second circuit board section, the boundary section including a set of outer surface elongated ground strips configured to form an electromagnetic interference seal;
   a set of electromagnetic interference shields configured to mount onto the set of outer surface elongated ground strips of the boundary section of the circuit board; and
   an enclosure configured to house the set of electromagnetic interference shields and the circuit board;
   wherein the first circuit board section, the second circuit board section, and the boundary section combine to form a substantially flat circuit board structure having a top outer surface and a bottom outer surface; and wherein the set of outer surface elongated ground strips includes:
   a top outer surface metallic band disposed along the top outer surface of the substantially flat circuit board structure, and a bottom outer surface metallic band disposed along the bottom outer surface of the substantially flat circuit board structure.

2. An electronic system as in claim 1 wherein the substantially flat circuit board structure has a right edge and a left edge, the right edge and left edge being substantially parallel to each other, and the right edge and the left edge being substantially perpendicular to a long axis of the boundary section; wherein the top outer surface metallic band extends completely from the right edge to the left edge of the substantially flat circuit board structure; and wherein the bottom outer surface metallic band extends completely from the right edge to the left edge of the substantially flat circuit board structure.

3. An electronic system as in claim 2 wherein the first circuit board section forms a front edge of the substantially flat circuit board structure; and wherein the first circuit board section which is configured to support the set of light emitting diodes along the top outer surface of the substantially flat circuit board structure proximate to the front edge.

4. An electronic system as in claim 3 wherein the first circuit board section defines mounting locations along the front edge in order to support the set of light emitting diodes in at least one row along the front edge.

5. An electronic system as in claim 4 wherein the first circuit board section includes conductive structures for carrying light emitting diode signals and power supply signals; and wherein the first circuit board section excludes conductive structures carrying high-speed signals for the high-speed electronic circuitry supported by the second circuit board section.

6. An electronic system as in claim 1 wherein the set of electromagnetic interference shields includes:
   a top electromagnetic interference shield configured to mount directly to the top outer surface metallic band and enclose a top of the first circuit board section; and
   a bottom electromagnetic interference shield configured to mount directly to the bottom outer surface metallic band and enclose a bottom of the first circuit board section.

7. An electronic system as in claim 6 wherein the high-speed electronic circuitry is mounted to the first circuit board section; and wherein the boundary section of the circuit board, in combination with the top electromagnetic interference shield and the bottom electromagnetic interference shield, form a Faraday cage around the high-speed electronic circuitry mounted to the first circuit board section.

8. An electronic system as in claim 7 wherein the set of light emitting diodes is mounted to the second circuit board section outside of the Faraday cage.

9. An electronic system as in claim 1 wherein the enclosure includes:
   a cover having a transparent portion and an opaque portion, the transparent portion being configured to permit light from the set of light emitting diodes to pass therethrough.

10. An electronic system as in claim 9 wherein the enclosure further includes:
    an assembly of light pipes which is fastened to the cover, the assembly of light pipes being adjacent the transparent portion of the cover and being configured to convey the light from the set of light emitting diodes to the transparent portion.

11. An electronic system as in claim 10 wherein the set of light emitting diodes includes a first row of light emitting diodes and a second row of light emitting diodes; wherein the assembly of light pipes includes:

a first row of light pipes rigidly attached directly to the transparent portion of the cover, the first row of light pipes being configured to convey light from the first row of light emitting diodes to the transparent portion, and a second row of light pipes rigidly attached directly to the transparent portion of the cover, the second row of light pipes being configured to convey light from the second row of light emitting diodes to the transparent portion, the first and second rows of light pipes being disposed along respective axes which are substantially parallel to each other.

12. An electronic system as in claim 1 wherein the first circuit board section is configured to support the set of light emitting diodes in a first row of light emitting diodes and a second row of light emitting diodes; and wherein the first row of light emitting diodes at least partially overlaps the second row of light emitting diodes to form a two-dimensional array of light emitting diodes.

13. An electronic system, comprising:

a set of light emitting diodes;

high-speed electronic circuitry;

a circuit board having (i) a first circuit board section which is configured to support the set of light emitting diodes, (ii) a second circuit board section which is configured to support the high-speed electronic circuitry, and (iii) a boundary section which defines an electromagnetic interference boundary between the first circuit board section and the second circuit board section, the boundary section including a set of outer surface elongated ground strips configured to form an electromagnetic interference seal;

a set of electromagnetic interference shields configured to mount onto the set of outer surface elongated ground strips of the boundary section of the circuit board; and means for enclosing the set of electromagnetic interference shields and the circuit board;

wherein the means for enclosing includes: a cover having a transparent portion and an opaque portion, the transparent portion being configured to permit light from the set of light emitting diodes to pass therethrough; and means for conveying the light from the set of light emitting diodes to the transparent portion.

14. An electronic system as in claim 13 wherein the first circuit board section is configured to support the set of light emitting diodes in a first row of light emitting diodes and a second row of light emitting diodes; and wherein the first row of light emitting diodes at least partially overlaps the second row of light emitting diodes to form a two-dimensional array of light emitting diodes.

15. A circuit board, comprising:

a first circuit board section which is configured to support a set of light emitting diodes;

a second circuit board section which is configured to support high-speed electronic circuitry; and a boundary section which defines an electromagnetic interference boundary between the first circuit board section and the second circuit board section, the boundary section including a set of outer surface elongated ground strips configured to form an electromagnetic interference seal onto which a set of electromagnetic interference shields is capable of mounting;

wherein the first circuit board section, the second circuit board section, and the boundary section combine to form a substantially flat circuit board structure having a top outer surface and a bottom outer surface; and wherein the set of outer surface elongated ground strips includes:

a top outer surface metallic band disposed along the top outer surface of the substantially flat circuit board structure; and a bottom outer surface metallic band disposed along the bottom outer surface of the substantially flat circuit board structure.

16. A circuit board as in claim 15 wherein the substantially flat circuit board structure has a right edge and a left edge, the right edge and left edge being substantially parallel to each other, and the right edge and the left edge being substantially perpendicular to a long axis of the boundary section; wherein the top outer surface metallic band extends completely from the right edge to the left edge of the substantially flat circuit board structure; and wherein the bottom outer surface metallic band extends completely from the right edge to the left edge of the substantially flat circuit board structure.

17. A circuit board as in claim 16 wherein the first circuit board section forms a front edge of the substantially flat circuit board structure; and wherein the first circuit board section which is configured to support the set of light emitting diodes along the top outer surface of the substantially flat circuit board structure proximate to the front edge.

18. A circuit board as in claim 17 wherein the first circuit board section defines mounting locations along the front edge in order to support the set of light emitting diodes in at least one row along the front edge.

19. A circuit board as in claim 18 wherein the first circuit board section includes conductive structures for carrying light emitting diode signals and power supply signals; and wherein the first circuit board section excludes conductive structures carrying high-speed signals for the high-speed electronic circuitry supported by the second circuit board section.

20. A circuit board as in claim 15 wherein the first circuit board section is configured to support the set of light emitting diodes in a first row of light emitting diodes and a second row of light emitting diodes where the first row of light emitting diodes at least partially overlaps the second row of light emitting diodes to form a two-dimensional array of light emitting diodes.

* * * * *